US009030892B2

(12) United States Patent
Watanabe et al.

(10) Patent No.: US 9,030,892 B2
(45) Date of Patent: May 12, 2015

(54) DATA READING DEVICE

(71) Applicant: Seiko Instruments Inc., Chiba-shi, Chiba (JP)

(72) Inventors: Kotaro Watanabe, Chiba (JP); Makoto Mitani, Chiba (JP)

(73) Assignee: Seiko Instruments Inc., Chiba (JP)

( * ) Notice: Subject to any disclaimer, the term of this patent is extended or adjusted under 35 U.S.C. 154(b) by 278 days.

(21) Appl. No.: 13/663,952

(22) Filed: Oct. 30, 2012

(65) Prior Publication Data

US 2013/0148444 A1 Jun. 13, 2013

(30) Foreign Application Priority Data

Dec. 8, 2011 (JP) ................................ 2011-268876

(51) Int. Cl.
*G11C 7/00* (2006.01)
*G11C 7/22* (2006.01)
*G11C 16/28* (2006.01)

(52) U.S. Cl.
CPC ..................................... *G11C 16/28* (2013.01)

(58) Field of Classification Search
USPC ................................. 365/189.15, 194, 233.1
See application file for complete search history.

(56) References Cited

U.S. PATENT DOCUMENTS

2010/0208531 A1 8/2010 Watanabe

FOREIGN PATENT DOCUMENTS

JP 2004-294260 A 10/2004
JP 2010-192039 A 9/2010

*Primary Examiner* — Kretelia Graham
(74) *Attorney, Agent, or Firm* — Brinks Gilson & Lione

(57) ABSTRACT

There is disclosed a data reading device in which data of a nonvolatile storage element is reflected in a circuit to be regulated, with a minimum necessary delay width after turning a power on or after reset cancellation, and wrong writing due to a static electricity is prevented. A delay circuit is additionally disposed to output a delayed data reading signal after a signal of turning the power on or a signal of the reset cancellation is generated. A delay time T2 and a static electricity convergence time T1 are set so as to keep a relation of T1<T2.

4 Claims, 5 Drawing Sheets

DATA READING DEVICE

RELATED APPLICATIONS

This application claims priority under 35 U.S.C. §119 to Japanese Patent Application No. 2011-268876 filed on Dec. 8, 2011, the entire content of which is hereby incorporated by reference.

BACKGROUND OF THE INVENTION

1. Field of the Invention

The present invention relates to a data reading device which reads data of a nonvolatile storage element.

2. Description of the Related Art

A conventional data reading device which reads data of a nonvolatile storage element will be described. FIG. 3 is a diagram showing the conventional data reading device. The data reading device is constituted of a crystal oscillation circuit 10, a frequency dividing circuit 20, an oscillation stop detection circuit 30, a reading signal generation circuit 40, and a data reading circuit 50.

The crystal oscillation circuit 10 outputs a source oscillation Φ1 for generating a timing to perform data reading. The frequency dividing circuit 20 divides a frequency of the source oscillation Φ1 generated by the crystal oscillation circuit 10 every ½ thereof, to generate an arbitrary frequency. Into the oscillation stop detection circuit 30, any frequency signal Φ3 divided by the frequency dividing circuit 20 is input. When the signal Φ3 outputs oscillation, an output Φ4 becomes high, and when the signal Φ3 does not output any oscillation, the output Φ4 becomes low.

Immediately after a power is turned on, the source oscillation Φ1 of the crystal oscillation circuit 10 is not output, and hence the Φ3 generated by the frequency dividing circuit 20 does not output any oscillation either. Therefore, the output Φ4 of the oscillation stop detection circuit 30 becomes low. A little time after the power is turned on, the oscillation of the crystal oscillation circuit 10 is started to output the source oscillation Φ1. Thus, the signal Φ3 of the frequency dividing circuit also outputs oscillation, and then the output Φ4 of the oscillation stop detection circuit 30 becomes high. In this way, the oscillation stop detection circuit 30 outputs a detection signal, when the oscillation of the crystal oscillation circuit 10 stops owing to the turning the power on or another influence.

Into the reading signal generation circuit 40, any frequency signal Φ2 divided by the frequency dividing circuit 20 and the output Φ4 of the oscillation stop detection circuit 30 are input. When the frequency signal Φ2 changes from a low signal to a high signal, a reading signal Φ50 which is an output changes from the high signal to the low signal, and becomes high again after a predetermined time. Moreover, when the output Φ4 changes from the low output to the high output, the reading signal Φ50 similarly changes from the high signal to the low signal, and becomes high again after the predetermined time.

The data reading by the frequency signal Φ2 is performed when there intermittently operates a circuit to be regulated, in which the data of the data reading circuit 50 is reflected. The data reading by the output Φ4 of the oscillation stop detection circuit 30 is performed when the circuit to be regulated, in which the data of the data reading circuit 50 is reflected, has to operate immediately after turning the power on, or after reset cancellation although not shown in the drawings. The data reading circuit 50 starts the data reading, when the reading signal Φ50 output by the reading signal generation circuit 40 becomes low. A timing chart of the conventional data reading device described up to here is shown in FIG. 5.

Such a constitution of the data reading circuit 50 as disclosed in Patent Document 1 or 2 is known. FIG. 4 is a diagram showing the data reading circuit disclosed in Patent Document 1.

An operation of the data reading circuit shown in FIG. 4 will be described.

First, Φ2 becomes high, and an NMOS transistor 54 turns on. In consequence, a latch circuit 55 is set, and a low signal is output through Dout. Next, after the Φ02 becomes low, Φ01 becomes low, and PMOS transistors 51 and 52 turn on. When an OTP element 53 has a depression state, i.e., a writing state, the latch circuit 55 inverts by an on-current of the OTP element, to output a high signal through Dout.

Although not clearly disclosed in Patent Document 1, a potential state around the nonvolatile storage element at the data reading is equal to the potential state at data writing.

Similarly, also in the constitution disclosed in Patent Document 2, the potential state around the nonvolatile storage element at the data reading is equal to the potential state at the data writing.

[Patent Document 1] JP-A-2010-192039

[Patent Document 2] JP-A-2004-294260

SUMMARY OF THE INVENTION

In a conventional data reading device, for example, when a static electricity is applied to a power source terminal, an oscillation stop detection circuit 30 performs a wrong operation, and an output changes from a low output to a high output sometimes. In consequence, while the static electricity is applied or discharged, a reading operation is started. A potential state around a nonvolatile storage element of a data reading circuit 50 at data reading is equal to the potential state at data writing, and hence there is the possibility that the data is wrongly written in the nonvolatile storage element.

According to the present invention, to achieve the above object, there is provided a data reading device including a delay circuit which delays a data reading signal generated after turning a power on or after reset cancellation.

According to the present invention, a constitution of a conventional data reading device may be used as it is, it is possible to reflect data of a nonvolatile storage element in a circuit to be regulated, with a minimum necessary delay width after turning a power on or after reset cancellation, and it is also possible to prevent wrong writing due to a static electricity.

DETAILED DESCRIPTION OF THE PREFERRED EMBODIMENTS

Hereinafter, the present embodiment will be described with reference to the drawings.

A constitution of a data reading oscillation device will be described.

Figure 1:
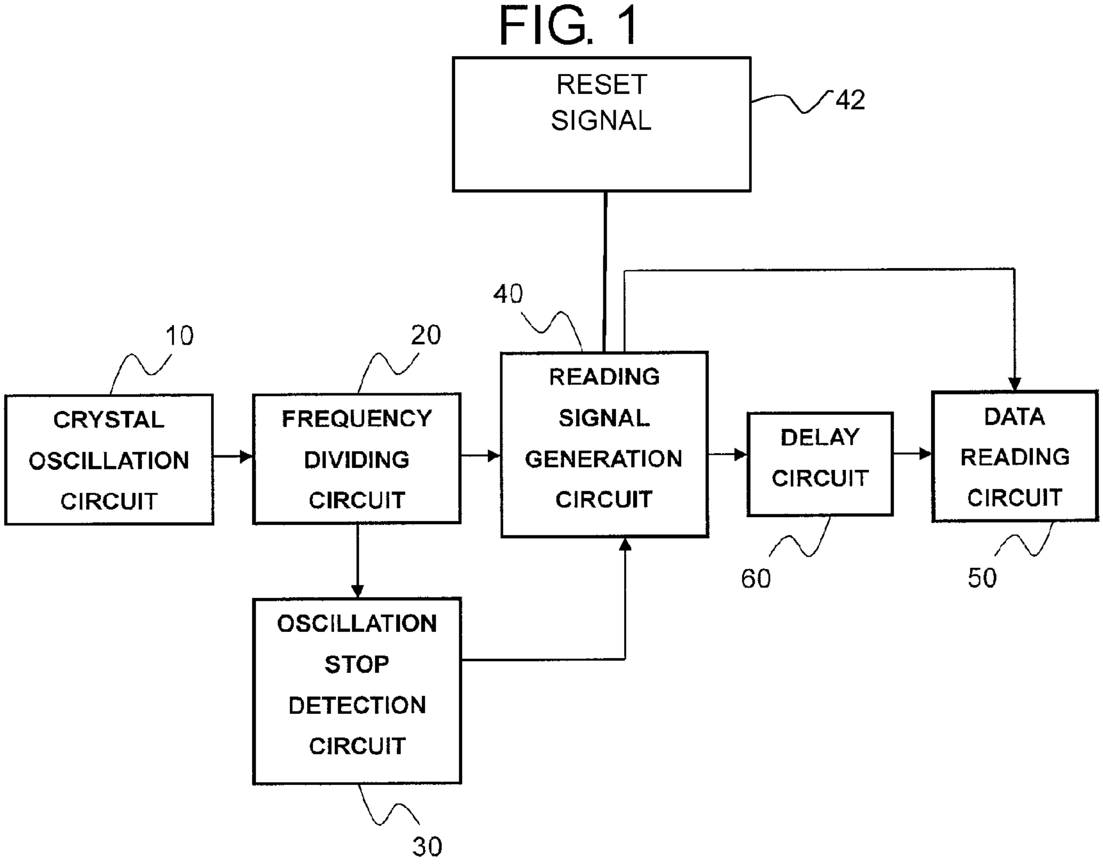
FIG. 1 is a diagram showing a data reading device of the present embodiment.

FIG. 1 is a diagram showing a data reading device of the present embodiment. The data reading device includes a crystal oscillation circuit 10, a frequency dividing circuit 20, an oscillation stop detection circuit 30, a reading signal generation circuit 40, a data reading circuit 50, and a delay circuit 60.

A source oscillation Φ1 which is an output of the crystal oscillation circuit 10 is connected to an input of the frequency dividing circuit 20. The frequency dividing circuit 20 divides a frequency of the source oscillation Φ1 of the crystal oscillation circuit 10 by an arbitrary number, to generate a signal. An arbitrary frequency signal Φ2 generated by the frequency dividing circuit 20 is connected to an input of the reading signal generation circuit 40. An arbitrary frequency signal Φ3 generated by the frequency dividing circuit 20 is connected to an input of the oscillation stop detection circuit 30. An output Φ4 of the oscillation stop detection circuit 30 is connected to another input of the reading signal generation circuit 40. A first reading signal Φ51 which is an output of the reading signal generation circuit 40 is connected to an input of the data reading circuit 50, and a second reading signal Φ52 which is another output of the reading signal generation circuit 40 is connected to an input of the delay circuit 60. An output Φ6 of the delay circuit 60 is connected to another input of the data reading circuit 50.

Next, an operation of the data reading device will be described.

[A Case Where a Reading Operation Is Periodically Performed]

When the reading operation is periodically performed, the arbitrary frequency signal Φ2 output by the frequency dividing circuit 20 is input into the reading signal generation circuit 40, and at a frequency synchronized with the arbitrary frequency signal Φ2, the first reading signal Φ51 is input into the data reading circuit 50, to perform data reading.

[A Case Where the Reading Operation Is Performed After Turning a Power on or After Reset Cancellation]

The case where the reading operation is performed after turning the power on will be described. After the power is turned on, the crystal oscillation circuit 10 does not normally operate, and the source oscillation Φ1 is not output. Therefore, the arbitrary frequency signal Φ3 input into the oscillation stop detection circuit 30 does not output any oscillation, and hence the output Φ4 of the oscillation stop detection circuit 30 becomes low. After a little time, the oscillation of the crystal oscillation circuit 10 is started, whereby the source oscillation Φ1 is also output. Then, the input Φ3 of the oscillation stop detection circuit 30 also outputs oscillation at an arbitrary frequency, and hence the output Φ4 of the oscillation stop detection circuit 30 changes from a low output to a high output. In consequence, the second reading signal Φ52 is generated by the reading signal generation circuit 40, and the Φ6 delayed as much as an arbitrary delay time T2 by the delay circuit 60 is input into the data reading circuit 50. The delay circuit 60 may be generated by a combination of the arbitrary frequency signals generated in the frequency dividing circuit 20, or by a generally known combination of a capacity and a resistance.

The operation after the reset cancellation will be described. A reset cancellation signal 42 is also input into the reading signal generation circuit 40, in addition to the output Φ2 of the frequency dividing circuit 20 and the output Φ4 of the oscillation stop detection circuit 30. The second reading signal Φ52 is generated in a case where the reset signal changes from a high signal to a low signal in the same manner as in the case where the output of the oscillation stop detection circuit 30 changes from the low output to the high output. Therefore, this operation is similar to the operation after the power is turned on.

A case where a static electricity is applied to an integrated circuit (IC) will be described. For example, when the static electricity is applied to a power source terminal of the IC, the static electricity is discharged by a static electricity protection circuit disposed in the IC, but a high voltage is applied to the power source terminal for a predetermined period of time T1. Even when the oscillation stop detection circuit 30 performs a wrong operation so that the output Φ4 thereof changes from the low output to the high output in this period, the data reading is not performed, and wrong writing in a nonvolatile storage element does not occur, while the high voltage is applied to the power source terminal. This is because the delay time T2 is set to T1<T2 by the delay circuit. Even when a reset cancellation state is obtained by the wrong operation due to the static electricity, the wrong writing of the nonvolatile storage element does not occur for a similar reason.

Figure 2:
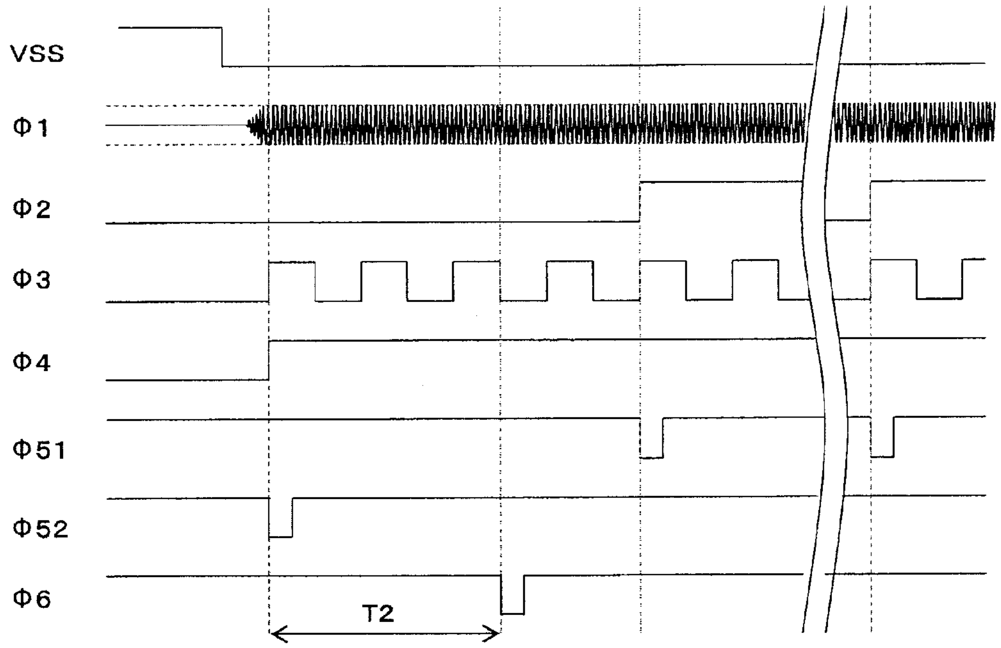
FIG. 2 is a timing chart of the data reading device of the present embodiment.
Figure 3:
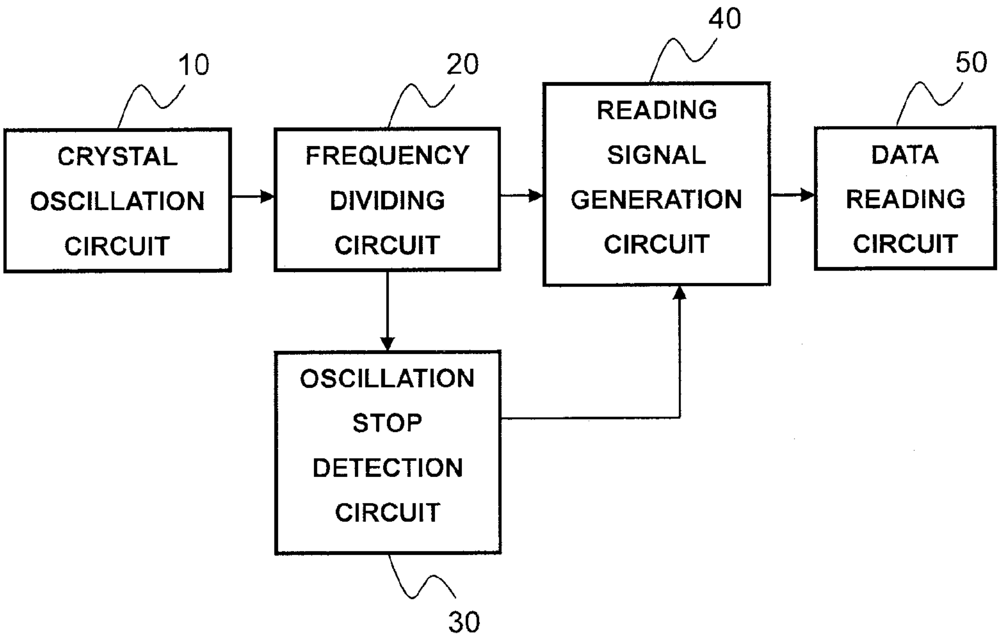
FIG. 3 is a diagram showing a conventional data reading device.
Figure 4:
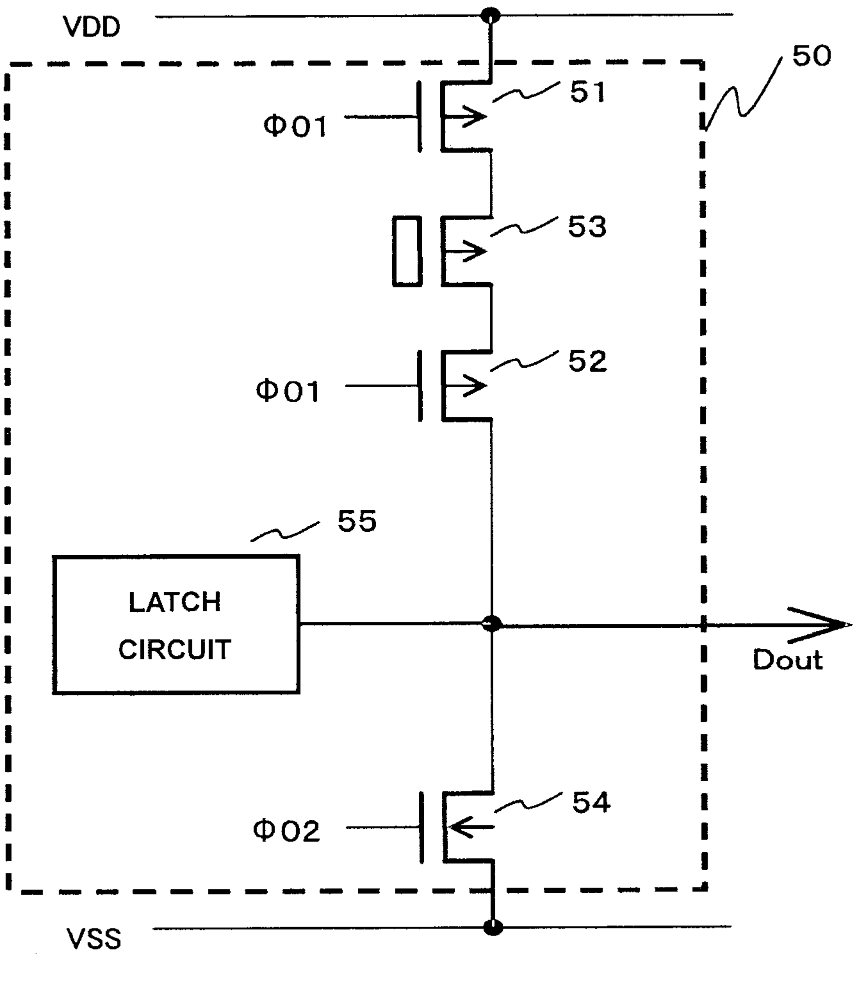
FIG. 4 is a diagram showing the conventional data reading device.
Figure 5:
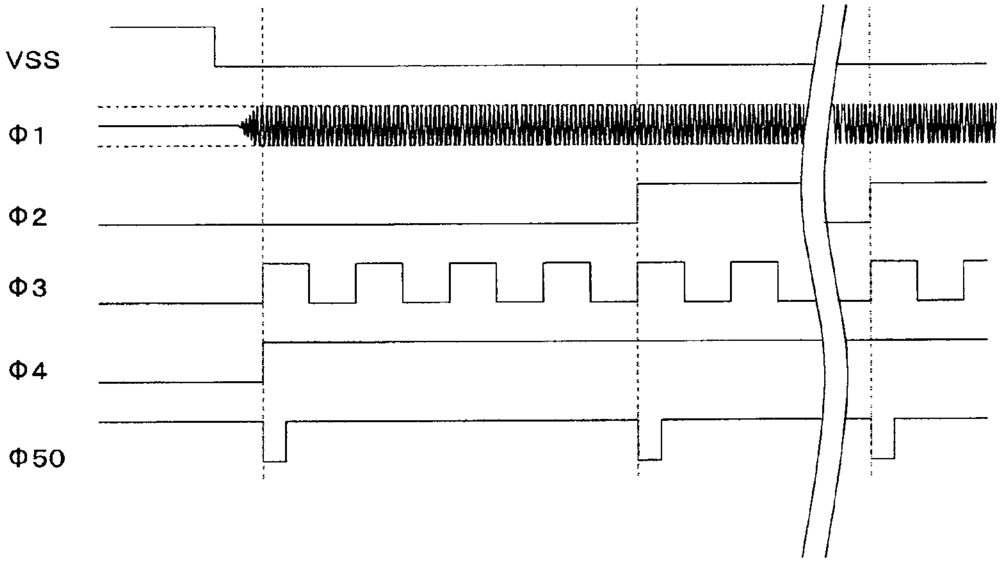
FIG. 5 is a timing chart of the conventional data reading device.

A timing chart of the data reading device of the present invention described up to here is shown in FIG. 2.

As the above, when the output Φ4 of the oscillation stop detection circuit 30 is generated, the output is delayed by the delay circuit and input into the data reading circuit, so that it is possible to reflect the data of the nonvolatile storage element in a circuit to be regulated, with a minimum necessary delay width after turning the power on or after the reset cancellation, and it is also possible to prevent the wrong writing due to the static electricity.

What is claimed is:

1. A data reading device comprising:

a crystal oscillation circuit which outputs a source oscillation for generation of a timing to perform data reading;

a frequency dividing circuit which divides a frequency of the source oscillation;

an oscillation stop detection circuit which detects whether the crystal oscillation circuit outputs oscillation, by use of an arbitrary frequency signal generated in the frequency dividing circuit;

a reading signal generation circuit which outputs a-data reading signals;

a delay circuit which delays the data reading signal; and a data reading circuit including a nonvolatile storage element, wherein the reading signal generation circuit outputs a first reading signal and a second reading signal, and into the data reading circuit where the second reading signal is delayed by the delay circuit.

2. The data reading device according to claim 1, wherein the reading signal generation circuit outputs the first reading signal when a signal synchronized with an arbitrary frequency is input, and outputs the second reading signal when an oscillation stop detection signal or a reset cancellation signal is input.

3. The data reading device according to claim 1, wherein a delay time T2 of the second reading signal is longer than a static electricity convergence time T1 of an integrated circuit.

4. The data reading device according to claim 2, wherein a delay time T2 of the second reading signal is longer than a static electricity convergence time T1 of an integrated circuit.

* * * * *

UNITED STATES PATENT AND TRADEMARK OFFICE

CERTIFICATE OF CORRECTION

PATENT NO. : 9,030,892 B2
APPLICATION NO. : 13/663952
DATED : May 12, 2015
INVENTOR(S) : Kotaro Watanabe et al.

It is certified that error appears in the above-identified patent and that said Letters Patent is hereby corrected as shown below:

In the Claims

In column 4, claim 1, line 42, after "which outputs" replace "a-data" with --data--.

In column 4, claim 1, line 48, after "a second reading" replace "signal, and" with --signal--.

Signed and Sealed this
Third Day of November, 2015

Michelle K. Lee
*Director of the United States Patent and Trademark Office*